United States Patent
Shinohara et al.

(10) Patent No.: US 8,436,406 B2
(45) Date of Patent: May 7, 2013

(54) SOLID-STATE IMAGE SENSING DEVICE AND CAMERA SYSTEM USING THE SAME

(75) Inventors: Mahito Shinohara, Tokyo (JP); Shunsuke Inoue, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/727,469

(22) Filed: Mar. 19, 2010

(65) Prior Publication Data

US 2010/0187581 A1     Jul. 29, 2010

Related U.S. Application Data

(60) Division of application No. 12/048,886, filed on Mar. 14, 2008, now Pat. No. 7,723,766, which is a division of application No. 11/316,868, filed on Dec. 27, 2005, now Pat. No. 7,423,305, which is a division of application No. 10/944,941, filed on Sep. 21, 2004, now abandoned, which is a continuation of application No. 10/463,604, filed on Jun. 18, 2003, now Pat. No. 6,885,047.

(30) Foreign Application Priority Data

Jun. 27, 2002 (JP) ................. 2002-187682
Oct. 17, 2002 (JP) ................. 2002-302912
Jun. 4, 2003 (JP) ................. 2003-159403

(51) Int. Cl.
*H01L 31/062* (2012.01)

(52) U.S. Cl.
USPC ........... 257/291; 257/233; 257/234; 257/258; 257/290; 257/461; 257/462

(58) Field of Classification Search ........... 257/233, 257/234, 258, 290, 291, 461, 462
See application file for complete search history.

(56) References Cited

U.S. PATENT DOCUMENTS 5,625,210 A    4/1997   Lee et al.
5,668,390 A    9/1997   Morimoto
(Continued)

FOREIGN PATENT DOCUMENTS

CN         1305229      7/2001
EP      0 978 878 A2     2/2000
(Continued)

OTHER PUBLICATIONS

Chinese Office Action issued Dec. 14, 2007, in Chinese Application No. 2005101287688.

(Continued)

*Primary Examiner* — Tan N Tran
(74) *Attorney, Agent, or Firm* — Fitzpatrick, Cella, Harper & Scinto

(57) ABSTRACT

A solid-state image sensing device includes a plurality of pixels. Each pixel has a photodiode, a first transistor, and a second transistor. The photodiode is constituted by a first-conductivity-type semiconductor region and a second-conductivity-type semiconductor region. The first and second conductivity types are opposite to each other. The first transistor has a first-conductivity-type drain region formed in the second-conductivity-type semiconductor region to transfer signal charge to the drain region. The second transistor has a source region and a drain region which are formed in the second-conductivity-type semiconductor region and which have the first conductivity type. At least one second-conductivity-type potential barrier is provided under the drain region of the first transistor and the source region and/or the drain region of the second transistor.

26 Claims, 12 Drawing Sheets

U.S. PATENT DOCUMENTS

| | | | |
|---|---|---|---|
| 5,801,373 | A | 9/1998 | Oozu et al. |
| 5,880,495 | A | 3/1999 | Chen |
| 5,942,774 | A | 8/1999 | Isogai et al. |
| 6,023,081 | A | 2/2000 | Drowley et al. |
| 6,026,964 | A | 2/2000 | Hook et al. |
| 6,150,676 | A | 11/2000 | Sasaki |
| 6,211,509 | B1 | 4/2001 | Inoue et al. |
| 6,218,691 | B1 | 4/2001 | Chung et al. |
| 6,259,124 | B1 | 7/2001 | Guidash |
| 6,281,531 | B1 | 8/2001 | Kamashita et al. |
| 6,339,248 | B1 | 1/2002 | Zhao et al. |
| 6,403,998 | B1 * | 6/2002 | Inoue .......................... 257/292 |
| 6,417,023 | B2 | 7/2002 | Suzuki et al. |
| 6,423,993 | B1 | 7/2002 | Suzuki et al. |
| 6,486,521 | B2 | 11/2002 | Zhao et al. |
| 6,504,193 | B1 | 1/2003 | Ishiwata et al. |
| 6,521,920 | B2 | 2/2003 | Abe |
| 6,521,925 | B1 | 2/2003 | Mori et al. |
| 6,521,926 | B1 * | 2/2003 | Sasaki ............................ 257/292 |
| 6,649,948 | B2 | 11/2003 | Inoue |
| 6,690,423 | B1 | 2/2004 | Nakamura et al. |
| 6,885,047 | B2 | 4/2005 | Shinohara et al. |
| 6,992,714 | B1 | 1/2006 | Hashimoto et al. |
| 7,423,305 | B2 | 9/2008 | Shinohara et al. |
| 2001/0006237 | A1 | 7/2001 | Abe |
| 2001/0015435 | A1 | 8/2001 | Suzuki et al. |
| 2002/0001039 | A1 | 1/2002 | Ishiwata |
| 2002/0032545 | A1 | 3/2002 | Mabuchi |
| 2002/0050593 | A1 | 5/2002 | Fukunaga et al. |
| 2002/0175355 | A1 * | 11/2002 | Shim .............................. 257/290 |

FOREIGN PATENT DOCUMENTS

| | | |
|---|---|---|
| EP | 1 028 470 A2 | 8/2000 |
| EP | 1 115 245 | 7/2001 |
| JP | 57-75073 | 5/1982 |
| JP | 11-233747 | 8/1999 |
| JP | 11-233749 | 8/1999 |
| JP | 11-274457 | 10/1999 |
| JP | 11-274461 | 10/1999 |
| JP | 11-284166 | 10/1999 |
| JP | 11-284168 | 10/1999 |
| JP | 2000-091551 | 3/2000 |
| JP | 2000-150848 | 5/2000 |
| JP | 2000-286405 | 10/2000 |
| JP | 2000-299453 | 10/2000 |
| JP | 2001-15727 | 1/2001 |
| JP | 2001-28433 | 1/2001 |
| JP | 2001-53260 | 2/2001 |
| JP | 2002-9270 | 1/2002 |
| JP | 2002-16242 | 1/2002 |
| JP | 2002-051263 | 2/2002 |
| JP | 4-152670 | 5/2002 |

OTHER PUBLICATIONS

Japanese Office Action issued Aug. 21, 2007, in Japanese Application No. 2005-273717.

Japanese Office Action dated Aug. 21, 2007, in Japanese application No. 2005-119658, and English-language translation.

European Search Report dated Mar. 27, 2008, in counterpart application No. 03014645.0-2203.

English translation of Aug. 21, 2007 Japanese Office Action in Japanese Application No. 2005-273717.

European Search Report dated Jul. 4, 2008, in application No. 03014645.0-2203/1376701.

Japanese Office Action issued Dec. 16, 2008, in Japanese Application No. 2005-119658.

European Search Report dated Jun. 10, 2010, in European Application No. 09171949.2-2203 / 2139039.

Mar. 19, 2013 European Search Report in European Patent Appln. No. 10184067.6-1552/2270863.

Mar. 22, 2013 European Search Report in European Patent Appln. No. 11160796.6-1552/2339631.

* cited by examiner

US 8,436,406 B2

SOLID-STATE IMAGE SENSING DEVICE AND CAMERA SYSTEM USING THE SAME

This is a divisional of U.S. patent application Ser. No. 12/048,886, filed Mar. 14, 2008, now pending, which is a divisional of U.S. patent application Ser. No. 11/316,868, filed Dec. 27, 2005, now U.S. Pat. No. 7,423,305, issued on Sep. 9, 2008, which is a divisional of U.S. patent application Ser. No. 10/944,941, filed Sep. 21, 2004, now abandoned, which is a continuation of U.S. patent application Ser. No. 10/463,604, filed Jun. 18, 2003, now U.S. Pat. No. 6,885,047, issued on Apr. 26, 2005.

BACKGROUND OF THE INVENTION

1. Field of the Invention

The present invention relates to a solid-state image sensing device and a camera system using the same.

2. Description of the Related Art

In recent years, the demand for solid-state image sensing devices has been rapidly increasing for use in image capturing apparatuses, such as, mainly, digital still cameras and video camcorders. As such solid-state image sensing devices, CCDs (Charge Coupled Devices) or MOS solid-state image sensing devices have been used. The former, as compared to the latter, are widely used as high-definition image sensing devices, due to their high sensitivity and low noise, but, on the other hand, have some disadvantages. Specifically, the power consumption and the drive voltage are high and the cost is high since a general semiconductor manufacturing process cannot be used. Additionally, it is difficult to integrate peripheral circuits, such as a drive circuit.

For these reasons, much effort has been devoted to the development of an amplifying-type MOS solid-state image sensing devices. In an amplifying-type solid-state image sensing devices, signal charge that is stored in a photodiode is introduced into the control electrode of an amplifying transistor, provided in each pixel, is amplified by the amplifying transistor, and the resulting output is output from the main electrode thereof in accordance with the amount of signal charge. In particular, for amplifying-type solid-state image sensing devices, efforts have been directed to the development of CMOS sensors using MOS transistors as amplifying transistors. The demand for portable telephones is projected to increase, and it is expected that MOS solid-state image sensing devices, which can overcome the above-described disadvantages of CCDs, will be applied to portable apparatuses.

FIG. 13 is a circuit diagram of a typical example of a CMOS sensor pixel for use in a solid-state image sensing device.

In FIG. 13, reference numeral 30 represents a unit pixel, 1 is a photodiode for storing signal charge generated from incident light, 6 is a amplifying MOS transistor for outputting an amplified signal in accordance with the amount of signal charge, and 3 is a floating diffusion (hereinafter may be referred to as "FD") region which receives a signal charge and connects the signal charge to the gate electrode of the amplifying MOS transistor 6. Reference numeral 2 represents a transfer MOS transistor for transferring signal charge stored in the photodiode 1 to the FD region 3, 4 is a reset MOS transistor for resetting the FD region 3, and 5 is a selection MOS transistor for selecting an output pixel. Reference numeral 9a is a control line for applying a pulse to the gate of the transfer MOS transistor 2 to control the charge-transfer operation, 9b is a control line for applying a pulse to the gate of the reset MOS transistor 4 to control the reset operation, and 9c is a control line for applying a pulse to the gate of the selection MOS transistor 5 to control the selection operation. Reference numeral 10a is a power-supply wire which is connected to the drain of the amplifying MOS transistor 6 and the drain of the reset MOS transistor 4 to provide a power-supply potential thereto. Reference numeral 10b is an output line for outputting an amplified signal of a selected pixel, 8 is a constant-current MOS transistor that operates as a constant current source and that forms a source follower in conduction with the amplifying MOS transistor 6, and 10c is a wire for supplying a potential to the gate electrode of the MOS transistor 8 so as to operate thereof at constant current.

An arrangement of a plurality of the above-described pixels 30 in a two-dimensional matrix provides a pixel area for a two-dimensional solid-state image sensing device. In the matrix configuration, the output line 10b is used as a common line for pixels in the same column and the control lines 9a, 9b, and 9c are each used as a common line for pixels in the corresponding row. Only pixels in a row that is selected by the control line 9c output signals to the corresponding output line 10b.

FIG. 14 is a circuit diagram of another pixel for a conventional solid-state image sensing device. In FIG. 14, reference numeral 1 represents a photodiode, 2 is a transfer MOS transistor for transferring charge of the photodiode 1, and 3 is a floating diffusion region for temporarily storing the transferred charge. Reference numeral 4 is a reset MOS transistor for resetting the floating diffusion region 3 and the photodiode 1, 5 is a selection MOS transistor for selecting one row in the array, and 6 is a source-follower MOS transistor. This source-follower MOS transistor 6 converts charge in the floating diffusion region 3 into a voltage and amplifies the voltage using a source-follower amplifier. Reference numeral 7 represents a read line, which is used as a common line in the same column, for reading a pixel voltage signal, and reference numeral 8 represents a constant current source for providing constant current to the read line 7.

The operation of this conventional solid-state image sensing device will be briefly described below. The photodiode 1 converts incident light into charge, and the transfer MOS transistor 2 causes the charge to be stored in the floating diffusion region 3. The potential of the floating diffusion region 3 and the photodiode 1 is reset to a constant potential in advance by opening the reset MOS transistor 4 and the transfer MOS transistor 2. Thus, the potential of the floating diffusion region 3 varies in accordance with charge generated from incident light.

The potential of the floating diffusion region 3 is amplified by the source-follower MOS transistor 6 and is output to the read line 7. When the selection MOS transistor 5 is open, that pixel is selected. An output circuit (not shown) detects optical signal components by determining the difference between the potential of the floating diffusion region 3 after optical signals are stored and the reset potential of the floating diffusion region 3.

FIG. 15 is a schematic sectional view of the solid-state image sensing device shown in FIG. 13. This schematic sectional view includes portions corresponding to the photodiode, the transfer MOS transistor, and the FD region. In this figure, reference numeral 11 represents an n-type semiconductor substrate, 12 is a p well, and 15 is an n-type semiconductor region formed in the p well 12. The p well 12 and the n-type semiconductor region 15 constitute a photodiode. Signal charge generated from incident light is stored in the n-type semiconductor region 15. Reference numeral 14 is a gate electrode of the transfer MOS transistor 2 shown in FIG. 13. Reference numeral 18 represents an FD region, which is an n-type semiconductor region formed in the p well 12 and also serves as the drain region of the transfer MOS transistor 2. The source region of the transfer MOS transistor corresponds to the n-type semiconductor region 15. Reference numeral 20 represents a wire that is connected to the FD region 18 and also to the gate electrode of an amplifying MOS transistor (not shown). Reference numeral 17 is an element-isolating insulating film, which is called a "LOCOS" oxide film. Reference numeral 29 is a p+ channel stopper, which is formed under the element-isolating insulating film 17 and has a doping concentration higher than the p well 12.

FIG. 16 is a schematic sectional view of the solid-state image sensing device shown in FIG. 14. This sectional view shows a combination of portions corresponding to the photodiode 1 and the transfer MOS transfer 2 shown in FIG. 14. Reference numeral 11 represents an n-type silicon substrate, 12 is a p well, 13a is a gate oxide film of the transfer MOS transistor 2, 13b is a thin oxide film provided on a light-receiving portion, 14 is the gate electrode of the transfer MOS transistor 2, and 15 is an n-type cathode of the photodiode 1. Reference numeral 16 represents a p-type surface region for providing a photodiode-buried structure, and 17 is a LOCOS oxide film for element isolation. Reference numeral 18 is a heavily-doped n-type region that forms a floating diffusion region and also acts as the drain region of the transfer MOS transistor 2. Reference numeral 19 is a silicon oxide film for providing insulation between the gate electrode and a first metal layer 21. Reference numeral 20 is a contact plug, 22 is an interlayer insulting film for providing insulation between the first metal layer 21 and a second metal layer 23, 24 is an interlayer insulating film for providing insulation between the second metal layer 23 and a third metal layer 25, and 26 is a passivation film. For a color photoelectrical conversion device, a color filter layer (not shown) is formed at the upper layer of the passivation film 26 and a micro-lens (not shown) is further formed thereon to improve the sensitivity. Incident light through the surface enters the photodiode through an aperture where the third metal layer 25 is not provided. The light is absorbed by the n-type cathode 15 of the photodiode or the p well layer 12, so that electron-hole pairs are produced. Of these pairs, electrons are stored in an n-type cathode region.

U.S. Pat. No. 6,403,998 discloses a solid-state image sensor in which a p-type buried layer is formed at a predetermined distance from an n-type substrate and a photoelectric conversion section is formed thereabove. In addition, U.S. Pat. No. 6,504,193 discloses a solid-state image device in which one end of a photodiode is formed to extend to a position under a readout gate and a punch-through stopper region is formed under a signal detection portion, which corresponds to the drain region, to be in self-alignment with the gate electrode.

With the conventional structures shown in FIGS. 15 and 16, however, part of signal charge generated below the photodiode is not absorbed by the photodiode, and is, in turn, absorbed by the FD region 18 and the source and drain regions of the transistor within the pixel. As a result, the sensitivity decreases.

Additionally, although various improvements have been made to CMOS solid-state image sensing devices, there is still a problem in that the sensitivity is low, particularly, in a device having a small pixel size. The present invention provides a CMOS solid-state image sensing device that has a novel structure and that can provide high sensitivity even for micro pixels.

A description is now given to a reason why the sensitivity in the conventional structure shown in FIG. 16 is low. Referring to FIG. 16, electrons that are generated from a light ray 27 entering the aperture are successfully stored in the n-type cathode region and serve as an effective signal charge. However, for example, as in the case of a light ray 28, electrons that are generated at a position somewhat away from the photodiode may be captured, not by the n-type cathode region, but by the n+ type floating diffusion region 18 where the potential is lower. In addition, even immediately under the photodiode, as a result of repeated diffusion and drift of electrons, the electrons are absorbed by a low potential region other than the photodiode with a certain probability and thus do not contribute as photoelectric conversion signals. When the n-type cathode 15 is formed at a position deeper relative to the silicon surface, such an arrangement facilitates the photodiode to collect the electrons. However, since the n-type cathode region is formed in the p well region 12 by ion implantation, the doping concentration cannot be reduced so significantly. This conventional structure also has a problem in that the n-type cathode 15 cannot be formed with a high doping concentration at a considerably deep position, due to the limitation of depletion behavior of the n-type cathode 15.

Thus, the volume of the n-type cathode, which provides the photodiode, is limited. Consequently, a sufficient ability of collecting electrons generated from incident light cannot be achieved, resulting in low sensitivity.

Meanwhile, the conventional structure disclosed in U.S. Pat. No. 6,403,998 also cannot prevent electrons that are generated at a deep position in response to incident light from being absorbed by the floating diffusion region 18 or the like, since no potential barrier is provided under the signal readout gate. Thus, this structure also has a problem in that the sensitivity decreases. Also, the conventional structure disclosed in U.S. Pat. No. 6,504,193 cannot prevent some of electrons that are generated from incident light from being absorbed by the source and drain of another transistor in the pixel or from being absorbed by adjacent pixels, since the punch-through stopper region is formed only under a signal detection portion. Thus, this structure also has a problem in that the sensitivity decreases as well.

SUMMARY OF THE INVENTION

It is an object of the present invention to provide a solid-state image sensing device that has high sensitivity, particularly, for micro pixels, and another object of the present invention is to provide a camera system that are low in power consumption and in drive voltage and low in cost.

To achieve the foregoing objects, according to a first aspect of the present invention, there is provided a solid-state image sensing device. The solid-state image sensing device has a plurality of pixels. Each pixel includes a photodiode that is constituted by a semiconductor region having a first conductivity type and a semiconductor region having a second conductivity type to generate signal charge. The first conductivity type and the second conductivity type are opposite to each other. Each pixel further includes a first transistor that has a drain region, which has the first conductivity type formed in the second-conductivity-type semiconductor region to transfer the signal charge to the drain region, and a second transistor that has a source region and a drain region, which are formed in the second-conductivity-type semiconductor region and which have the first conductivity type. At least one potential barrier having the second conductivity type is provided under the drain region of the first transistor and the source region and/or the drain region of the second transistor. With arrangement, since the at least one potential barrier is provided under an FD region and the source electrode and/or the drain electrode of each transistor, thereby increasing the sensitivity. This is because signal charge that is generated below the potential barrier is not absorbed by the FD region and the source region and/or the drain region, under which the potential barriers are provided, of each transistor.

According to a second aspect of the present invention, there is provided a solid-state image sensing device. The solid-state image sensing has at least one pixel. Each pixel includes a photodiode that is constituted by a semiconductor region having a first conductivity type and a semiconductor region having a second conductivity type. The first conductivity type and the second conductivity type are opposite to each other. Each pixel further includes a transistor that has a source region and a drain region which are provided in the first-conductivity-type semiconductor region and which have the first conductivity type. A potential barrier having the second conductivity type is provided under the gate electrode of the transistor. With this arrangement, the potential barrier that is provided under the gate electrode of an n-type transistor, which constitutes the pixel, prevents short-circuiting between the source and drain. The potential barrier also serves to allow the n-type transistor, provided even in an n-type semiconductor region, to operate.

According to a third aspect of the present invention, there is provided a solid-state image sensing device. The solid-state image sensing device includes a substrate having a first conductivity type, a layer having a second conductivity type, and a layer having the first conductivity type. The second-conductivity-type layer and the first-conductivity-type layer form a photodiode. At least one potential barrier, which is formed by a region having the second conductivity type, is provided around a region where the photodiode is formed.

The second-conductivity-type region may be provided in the first-conductivity-type layer and the second-conductivity-layer may be a buried layer. The second-conductivity-type region may extend to the second-conductivity-type buried layer in the depth direction. With this arrangement, when an n-type layer for the photodiode is surrounded by the buried layer having the opposite conductivity type and the layer having the same conductivity type as that of the buried layer, potential barriers are provided against electrons. In addition, this arrangement allows the photodiode to have a low doping concentration and to have a large volume, thereby increasing a collecting ability of optical signals.

The potential barrier may be constituted by a plurality of potential barriers that is arranged at a plurality of layers in the depth direction of the first-conductivity-type layer. With this arrangement, in a structure having a deep n-type layer for the photodiode, that is, in a structure having sensitivity even at a longer wavelength, providing a plurality of p-type layers allows for formation of effective potential barriers.

The uppermost layer of the plurality of layers may control a charge transfer path from the photodiode to a transfer transistor. This arrangement can achieve a structure in which the transfer transistor can secure transfer of signals from the photodiode.

A portion in at least the vicinity of the opposite-conductivity-type buried layer in the first-conductivity-type layer may have a lower doping concentration than the surrounding opposite-conductivity-type layer. With this arrangement, when the photodiode is reverse biased at the time of storing charge, a depletion layer effectively extends toward the n-type layer to facilitate complete depletion. Since the well layer and the buried layer are placed at substantially the same position in the horizontal plane direction, less photomask processing is required. Thus, this arrangement can provide a higher isolation effect.

The first-conductivity-type layer may have a region having a doping concentration higher than the other regions, in a portion adjacent to the semiconductor surface. With this arrangement, electron potentials at the semiconductor surface become lower than in the other portions, and thus electrons gather in the vicinity of the surface at the time of storing charge. Consequently, electrons are less likely to remain at the time of transferring charge.

The first-conductivity-type layer may be completely depleted during charge transfer. This arrangement can provide a "complete-transfer" photodiode, which allows for the determination of the concentration in the depth direction so that the photodiode that is surrounded by the opposite-type-conductivity layer is depleted due to reverse biasing and which has no reset noise.

According to a fourth aspect of the present invention, there is provided a method for manufacturing the solid-state image sensing device of the third aspect of the present invention. In this manufacturing method, after the first-conductivity-type layer is formed on the opposite-conductivity-type buried layer, the opposite-conductivity-type layer is formed by ion implantation. This manufacturing method allows for the manufacture of a solid-state image sensing device that can deal with various spectral characteristics, by changing the thickness of the epitaxial layer.

According to a fifth aspect of the present invention, there is provided a method for manufacturing the solid-state image sensing device of the third aspect of the present invention. In this manufacturing method, the opposite-conductivity-type buried layer is formed in such a manner that, after ions are implanted into the first-conductivity-type semiconductor substrate, ions are implanted into the opposite-conductive-type buried layer. This manufacturing method allows for formation of a uniform buried layer within a surface in the depth direction with high reproducibility by ion implantation, when there is no need to have a significantly high spectral sensitivity at a longer wavelength.

In addition, an isolation region may be provided between adjacent pixels by STI (Shallow Trench Isolation). Since STI is used, even for minute pixels, it is possible to provide an image sensing device which has less charge leakage between adjacent pixels, which has low crosstalk, and which has high sensitivity.

The entire contact surface between an oxide film, which is formed by the STI and which isolates pixels, and silicon may be covered by the first-conductivity-type semiconductor layer. With this arrangement, a depletion layer is not formed at the interface between the oxide film and the silicon during STI, which can provide an image sensing device having less noise when it is dark.

An isolation region may be provided between adjacent pixels by deep trench isolation. With this arrangement, for minute pixels, isolations between the pixels can further be enhanced, which can provide an image sensing device having low cross talk and having high sensitivity.

The entire contact surface between an oxide film, which is formed by the deep trench isolation and which isolates pixels, and silicon may be covered by the first-conductivity-type semiconductor layer. With this arrangement, a depletion layer is not formed at the interface between the oxide film and the silicon during deep trench isolation, which can provide an image sensing device having less noise when it is dark.

Further objects, features and advantages of the present invention will become apparent from the following description of the preferred embodiments with reference to the attached drawings.

DESCRIPTION OF THE PREFERRED EMBODIMENTS

First Embodiment

Figure 1:
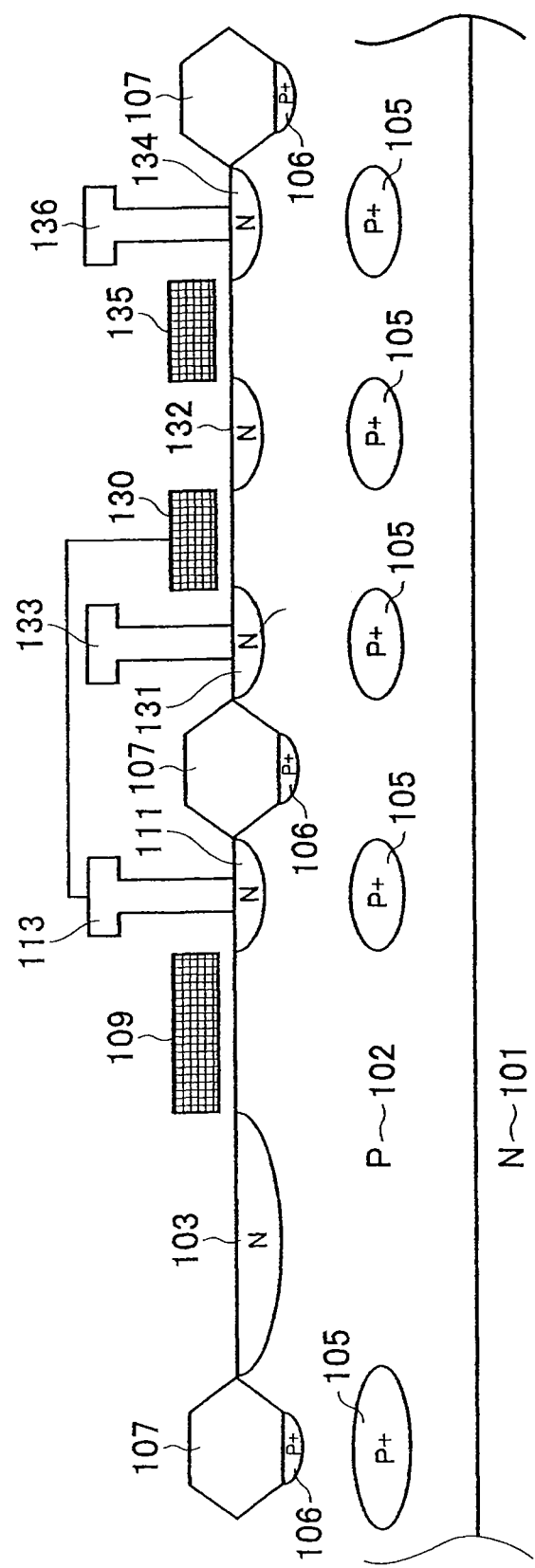
FIG. 1 is a schematic sectional view of a solid-state image sensing device according to a first embodiment of the present invention.

FIG. 1 is a schematic sectional view of a solid-state image sensing device according to a first embodiment of the present invention.

In FIG. 1, reference numeral 101 represents a semiconductor substrate having a first-conductivity-type (n-type in this case by way of example), 102 is a p well which is a second-conductivity-type semiconductor region, and 103 is an n-type semiconductor region which is formed in the p well 102 and which is a first-conductivity-type semiconductor region. The p well 102 and the n-type semiconductor region 103 constitute a photodiode. Signal charge that is generated from incident light is stored in the n-type semiconductor region 103. Reference numeral 111 represents a drain region of a transfer transistor, which is a first transistor, for transferring signal charge generated by the photodiode. The drain region has the first conductivity type and serves as an FD region and an n-type semiconductor region formed in the p well 102. Reference numeral 109 represents a gate electrode of the transfer transistor. The n-type semiconductor regions 103 and 111 serve as the source region and the drain region of the transfer transistor, respectively. Reference numeral 113 is a wire that is connected to the n-type semiconductor region 111 and also to a gate electrode 130 of an amplifying transistor, which is a second transistor. The amplifying transistor is constructed such that the gate electrode 130 is provided between a source region 131 and a drain region 132. Reference numeral 133 is a vertical signal line that is connected to the source region 131. The drain region 132 serves not only as the drain electrode of the amplifying transistor but also as the source region of a selection transistor, which is another second transistor. Reference numeral 134 represents a drain electrode of the selection transistor, and a gate electrode 135 is formed between the source electrode 132 and drain electrode 134. Reference numeral 136 is a drain line that is connected to the drain electrode 134 of the selection transistor. Reference numeral 107 represents element-isolating insulating films that are formed with thick oxide films. Reference numeral 106 represents p+ channel stoppers that are formed under the element-isolating insulating films 107 and that have a higher doping concentration than the p well 102. Reference numeral 105 represents potential barriers. The potential barriers 105 are formed with p-type semiconductor regions, which have the same conductivity type as the p well 102.

Herein, it should be noted that a transfer transistor is referred to as a "first transistor" and transistors, other than the transfer transistor, which are formed in a pixel are referred to as "second transistors".

Signal charge stored in the n-type semiconductor region 103 is transferred to the FD region 111 during a transfer operation. The concentration of n-type dopants in the n-type semiconductor region 103 is set such that the n-type semiconductor region 103 is depleted immediately after a transfer.

In the solid-state image sensing device of this embodiment, one pixel is constituted by the photodiode, transfer transistor, amplifying transistor, and selection transistor. The configuration of one pixel, however, is not limited to this particular embodiment. For example, one pixel may be constituted by a transfer transistor and amplifying transistor. Alternatively, one pixel may be constituted by a photodiode, transfer transistor, amplifying transistor, selection transistor, and reset transistor.

The Potential barriers 105 in the present invention are characterized in that they are provided under the drain region of the first transistor and the source regions and/or the drain regions of the second transistors. When a plurality of second transistors is formed, at least one potential barrier 105 is provided so as to correspond to at least one source region and/or drain region thereof.

The potential barriers 105 have a p-type impurity at a concentration higher than the p well 102. While the channel stoppers 106 and the potential barriers 105 are semiconductor regions having the same p+ type, the doping concentrations thereof may, of course, be different from each other. The potential barriers 105 are provided by implanting, for example, boron or gallium into the p well 102 using ion implantation.

As shown in FIG. 1, the potential barriers 105 in the present invention are formed under the FD region 111 and the source and drain regions 131, 132, and 134 of the amplifying transistor and the selection transistor.

As in the present invention, providing the potential barriers 105 under an FD region and the source electrode and/or the drain electrode of each transistor can improve the sensitivity.

This is because signal charge that is generated below the potential barriers 105 is not absorbed by the FD region 111 and the source region and/or the drain region, under which the potential barriers 105 are provided, of each transistor.

In addition, this arrangement is preferable because providing more potential barriers 105 under the source and drain regions of the second transistors provides a structure in which signal charge is less likely to be absorbed by regions other than the photodiode.

The potential barriers 105 may also be provided under the element-isolating insulating films 107. Providing the potential barriers 105 under the element-isolating insulating films 107 can provide a structure in which signal charge is less likely to be absorbed by a photodiode or transistor within an adjacent pixel, thereby preventing signal charges between the adjacent pixels from being mixed.

Second Embodiment

Figure 2:
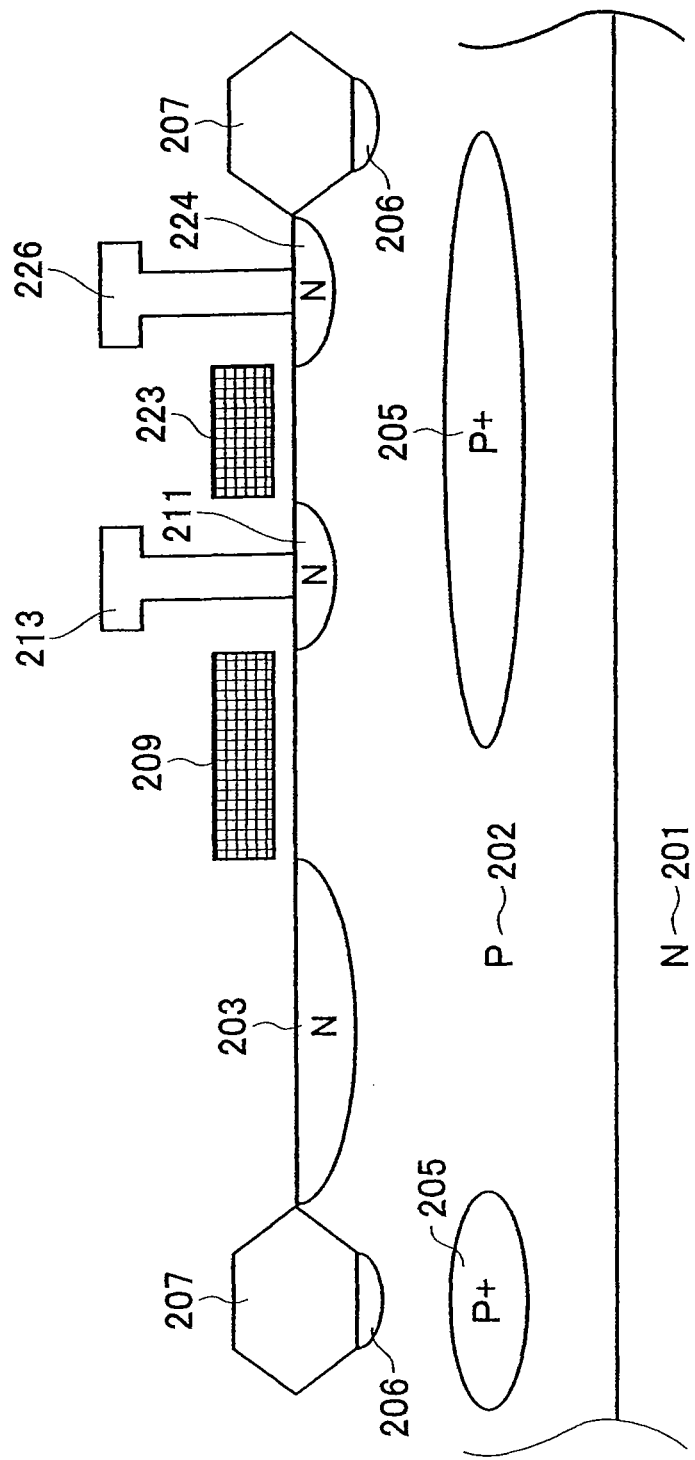
FIG. 2 is a schematic sectional view of a solid-state image sensing device according to a second embodiment of the present invention.

FIG. 2 is a schematic sectional view of a solid-state image sensing device according to a second embodiment of the present invention.

More specifically, FIG. 2 is a schematic sectional view of a solid-state image sensing device having a photodiode, a transfer transistor and a reset transistor for resetting an FD electrode 211. Thus, this solid-state image sensing device has a reset transistor, serving as a second transistor, for resetting the FD electrode 211.

In FIG. 2, reference numeral 223 represents a gate electrode of the reset transistor for resetting the FD electrode 211 and reference numeral 224 represents a drain region of the reset transistor and is connected to a power-supply line 226.

This embodiment is different from the first embodiment described above in that a potential barrier 205 is also provided under the gate electrode 223 of the second transistor. Thus, the potential barrier 205 reduces the amount of signal charge that is absorbed by n-type semiconductor regions other than the photodiode, thereby enhancing the sensitivity.

While the second transistor in this embodiment has been described in conjunction with the reset transistor by way of example, it may be an amplifying transistor or selection transistor as in the first embodiment. In addition, a plurality of second transistors may be provided.

For example, the potential barriers 205 of the present invention may be provided in a solid-state image sensing device in which each pixel is constituted by a photodiode, transfer transistor, reset transistor, amplifying transistor, and selection transistor.

Providing the potential barriers 205 under the gate electrodes, source regions, and drain regions of all the transistors provided within a pixel makes it more difficult for signal charge to be absorbed by regions other than the photodiode, thereby improving the sensitivity.

In addition, providing the potential barriers 205 under the element-isolating insulating regions 207 can provide a solid-state image sensing device in which the potential barriers 205 are provided in regions deeper than the source and drain regions of the transistors so as to surround the photodiode.

As described above, providing the potential barriers 205 around the photodiode makes it difficult for signal charge, generated by the photodiode, to be absorbed by the source or drain region of the adjacent transistor, thereby enhancing the sensitivity.

The potential barriers 205 that are provided so as to surround the photodiode may have at least one opening.

With a structure in which the potential barriers 205 without an opening therein are provided around the photodiode, when signal charge overflows from the photodiode, blooming is prone to occur since the signal charge that overflows therefrom is not easily absorbed by the surrounding n-type semiconductor region. Accordingly, it is preferable that an opening having no potential barrier 205 therein be provided in at least one portion around the photodiode to absorb signal charge that overflows therefrom so that blooming can be suppressed.

Third Embodiment

Figure 3:
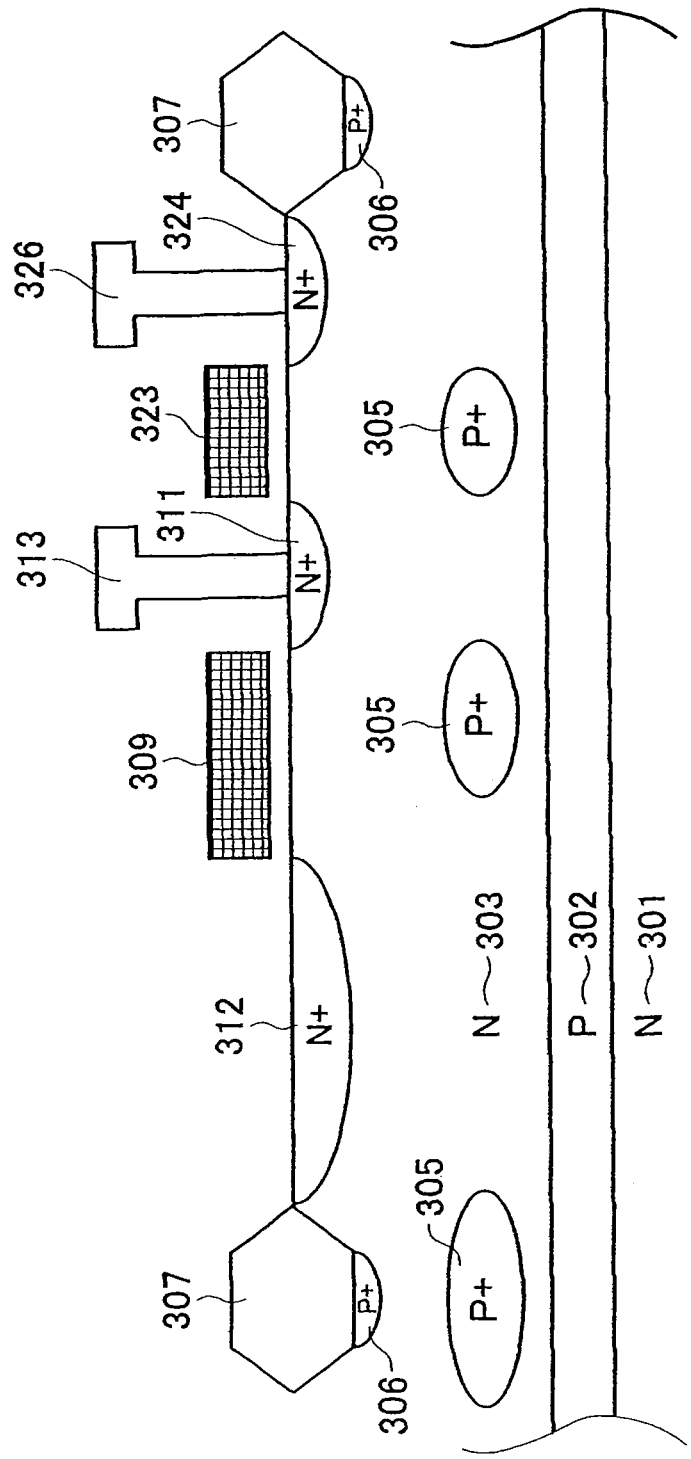
FIG. 3 is a schematic sectional view of a solid-state image sensing device according to a third embodiment of the present invention.

FIG. 3 is a schematic sectional view of a solid-state image sensing device according to a third embodiment of the present invention.

Specifically, FIG. 3 is a schematic sectional view of a solid-state image sensing device having a photodiode, a transfer transistor, and a reset transistor for resetting an FD electrode 311.

Referring to FIG. 3, an n well or n-type semiconductor region 303 is provided as a first-conductivity-type semiconductor region at a layer above an n-type semiconductor substrate 301. A p-type semiconductor region 302 is provided as a second-conductivity-type semiconductor region. The p-type semiconductor region 302 and the n-type semiconductor region 303 constitute a photodiode. A first-conductivity-type signal-charge storing region 312 collects and stores signal charge generated by the photodiode and has a doping concentration higher than the n-type semiconductor region 303.

The difference between the configurations shown in FIGS. 2 and 3 is as follows. In the configuration shown FIG. 2, in the p well 202, the transistors having the n-type source and drain regions, which type being opposite to that of the p well, are formed, and also the potential barriers 205 have the same conductivity type as the p well 202. In contrast, in this embodiment shown in FIG. 3, in the n-type semiconductor region 303 which is a first-conductivity-type semiconductor region, transistors having the source and drain regions of the same conductivity type as that of the n-type semiconductor region 303 are formed. Further, p-type potential barriers 305 having an opposite conductivity type to that of the n-type semiconductor region 303 are provided.

In this embodiment, as transistors that constitute a pixel in conjunction with the photodiode, a transfer transistor for transferring signal charge generated by the photodiode and a reset transistor for resetting the FD electrode 311 are illustrated. The transistors, however, are not limited to this particular configuration. For example, transistors provided in the pixel may be any one or a combination of a transfer transistor, reset transistor, amplifying transistor, selection transistor, and the like.

In this embodiment, the potential barriers 305 that are provided under the gate electrodes of the n-type transistors, which constitute the pixel, prevent short-circuiting between the sources and drains. The potential barriers 305 also serve to allow the n-type transistors, provided even in the n-type semiconductor region 303, to operate.

The potential barriers 305 that are placed under the gate electrodes may be sized so as to correspond to the gate regions or may be formed under parts of the gate electrodes.

Thus, in this embodiment, the potential barrier 305 that is placed under the gate electrode 309 of the transfer transistor is positioned under part of the gate electrode 309, and the potential barrier 305 that is sized to correspond to the gate electrode 323 is provided under the gate electrode 323 of the reset transistor.

Herein, the potential barriers provided under the source and drain regions may also be positioned under parts of the source and drain regions.

In a pixel structure as shown in FIG. 3, since the n-type region of the photodiode is formed deep in the light traveling direction, quantum efficiency for the signal charge is enhanced, even compared to the first embodiment.

In the third embodiment, since the n-type transistors in the pixel are formed in the n-type semiconductor region, the threshold potential of the n-type transistors becomes lower than the threshold potential of the conventional n-type transistors. This makes it possible to increase the input/output range of the amplifying transistor.

The threshold potential of the transistors in this embodiment allows a fluctuation due to a back-gate effect to decrease and allows an increase in the gain compared to the conventional configurations.

The potential barriers 305 may also be provided under the element-isolating insulating regions 307. Providing the potential barriers 305 under the element-isolating insulating films 307 can provide a structure in which signal charge is less likely to be absorbed by a photodiode or transistor in an adjacent pixel, thereby preventing signal charges between the adjacent pixels from being mixed.

Fourth Embodiment

Figure 4:
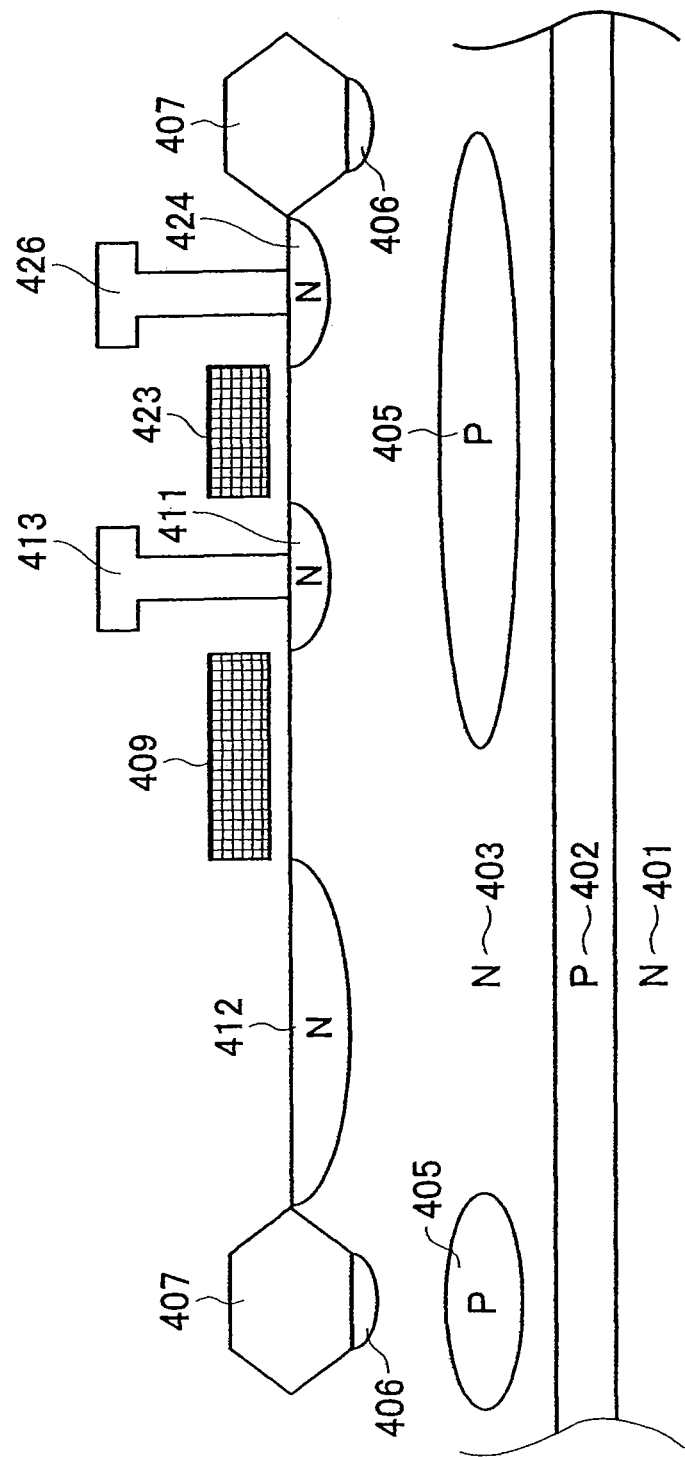
FIG. 4 is a schematic sectional view of a solid-state image sensing device according to a fourth embodiment of the present invention.

FIG. 4 is a schematic sectional view of a solid-state image sensing device according to a fourth embodiment of the present invention.

This embodiment is different from the third embodiment shown in FIG. 3 in that a potential barrier 405 is provided not only under the gate of a transistor but also under the source region and/or the drain region of the transistor provided in a pixel.

Providing the potential barrier 405 under the source region and/or the drain region as well as under the gate can provide a structure in which signal charge generated below the potential barrier 405 is less likely to be absorbed by the source region and/or the drain region of the transistor, thereby further enhancing the sensitivity.

In this embodiment, a transfer transistor for transferring signal charge generated by the photodiode and a reset transistor for resetting an FD electrode are illustrated as transistors provided in the pixel. The transistors, however, are not limited to this particular configuration. For example, the transistors in the pixel may be any one or a combination of a transfer transistor, reset transistor, amplifying transistor, selection transistor, and the like.

The potential barrier 405 may also be provided under the element-isolating insulating film 407. Providing the potential barrier 405 under each element-isolating insulating film 407 can provide a structure in which signal charge is less likely to be absorbed by a photodiode or transistor in an adjacent pixel, thereby preventing signal charges between the adjacent pixels from being mixed.

As described above, providing the potential barriers 405 around the photodiode makes it difficult for signal charge, generated by the photodiode, to be absorbed by the source or drain region of the adjacent transistor, thereby enhancing the sensitivity compared to a case in which no potential barrier is provided. The potential barriers 405 that are provided so as to surround the photodiode may have at least one opening therein where no potential barrier is provided.

With a structure in which the potential barriers 405 without an opening therein are provided around the entire periphery of the photodiode, when signal charge overflows from the photodiode, blooming is prone to occur since the signal charge that overflows therefrom is not easily absorbed by the surrounding n-type semiconductor region. Accordingly, providing an opening, where the potential barrier 405 is not provided, in at least one portion around the photodiode allows blooming to be suppressed by absorbing signal charge that overflows from the photodiode.

As an alternative for suppressing blooming, a so-called "vertical overflow drain" structure is available. In the structure, the doping concentration of a p-type semiconductor region 402 is made lower than the doping concentration of the potential barriers 405 to permit signal charge that overflows from the photodiode to escape into an n-type semiconductor substrate 401. Such a structure can eliminate the need for providing the above-described opening, thereby enhancing the sensitivity compared to a case in which the above-described opening is not provided.

In this embodiment, a signal-charge storing region 412 is provided, but does not necessarily have to be provided. A so-called "buried photodiode" may be employed. That is, a p-type semiconductor region may be formed at the semiconductor interface portion of the signal-charge storing region 412 or the n-type semiconductor region in which signal charge is stored.

As the pixel structure in the first to fourth embodiments described above, a structure in which the polarities of the n-type and p-type layers and portions are all inverted may be used.

Fifth Embodiment

Figure 5:
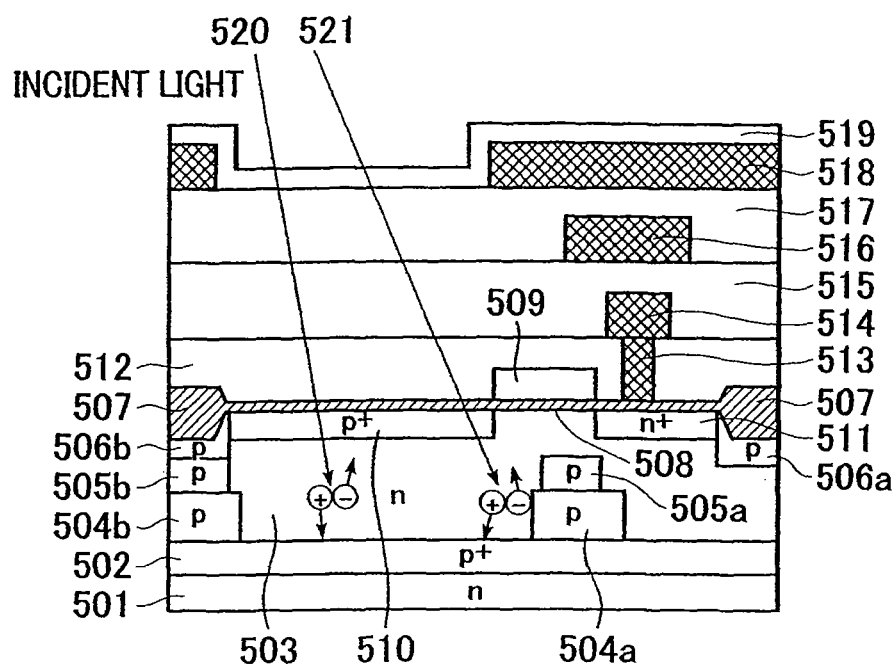
FIG. 5 is a schematic sectional view of a solid-state image sensing device according to a fifth embodiment of the present invention.

A fifth embodiment will now be described with reference to FIG. 5. FIG. 5 is a schematic sectional view of a solid-state image sensing device according to a fifth embodiment of the present invention.

Figure 16:
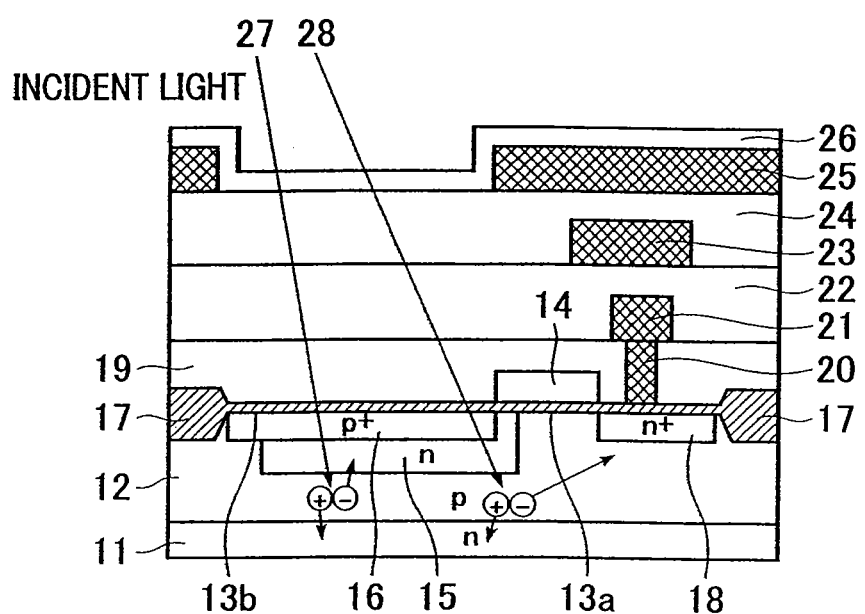
FIG. 16 is a schematic sectional view of the solid-state image sensing device shown in FIG. 14.

In FIG. 5, a photodiode portion, a transfer MOS transistor portion, and a floating diffusion portion within a pixel are shown, as in the conventional example shown in FIG. 16. Reference numeral 501 is an n-type silicon substrate, 502 is a heavily-doped p-type buried layer, 503 is an n-type epitaxial layer that acts as the cathode of the photodiode, 504a and 504b are p-type isolation layers, and 505a and 505b are p well layers. Reference numeral 506a is a channel-stop p-type layer that is provided under a field oxide film 507. Reference numeral 508 is a gate oxide film of the transfer MOS transistor, 509 is the polysilicon gate of the transfer MOS transistor, and 510 is a p-type surface layer for providing a buried-photodiode structure. Reference numeral 511 is an n-type drain diffusion region for the transfer MOS transistor. The n-type drain diffusion region 511 acts as a floating diffusion portion that temporarily stores transferred charge. Further, reference numeral 512 represents a first interlayer insulating film, 513 is a contact plug, 514 is a first-layer wiring layer, 515 is a second insulating film, 516 is a second-layer wiring layer, 517 is a third interlayer insulating film, 518 is a third-layer wiring layer, and 519 is a passivation film.

While three wiring layers are formed in this embodiment, the number of wiring layers may be one or two to ensure optical properties depending on the specifications of the sensor. It is to be noted that such a configuration is also consistent with the essence of the present invention. When the solid-state image sensing device of this embodiment is used as a color-image sensing device, forming a color filter layer on the passivation film and further forming a micro-lens above the color filter layer can improve the photosensitivity, in the same manner as in conventional image sensing devices. Also, the p-type isolation layers 504a and 504b and the p well layers

505a and 505b, together with the heavily-doped p-type buried layer 502, surround the n-type epitaxial region 503 that acts as the cathode of the photodiode. This structure provides electrical isolation between the photodiodes of adjacent pixels.

Of electron-hole pairs generated in the pixel from incident light rays 520 and 521, electrons are securely stored as signal charge in the photodiode by potential barriers provided by the various p-type layers surrounding the n-type epitaxial layer 503. The p well layer 505a is placed almost immediately under the transfer MOS transistor, and also controls a transfer path for transferring electrons that are stored in the n-type epitaxial layer 503 to the floating diffusion portion 511 through the channel of the transfer MOS transistor. Appropriately designing the concentrations, depths, and horizontal directions of the p well layers 505a and 505b enables the n-type epitaxial layer 503 to be completely depleted in response to application of a read voltage to the MOS gate 509.

The p well layer 505a, which is electrically connected with the p-type isolation layer 504a, acts as a well for the charge transfer MOS transistor to control the threshold voltage thereof. Another p-type layer 505a is also arranged under another transistor within the pixel and also acts as a well for the transistor. The heavily-doped p-type buried layer 502 is arranged at a depth that provides spectral characteristics needed by the sensor. In terms of forming the potential barriers, a doping concentration of 1E15 (/cm$^3$) or more is sufficient. Also, in order to reduce electrical resistance, it is desirable to form the heavily-doped buried layer 502 with a high concentration. However, implantation with a high dosage of ions with high energy leads to an increase in manufacturing cost. Thus, in reality, the upper limit of the concentration depends on such a factor.

The horizontal positions of the p-type isolation layers 504a and 504b are determined, based on the aperture area of the photodiode and a position at which incident light can reach. It is sufficient for the doping concentration to be 1E15 (/cm$^3$) or more in order to allow for the formation of the potential barriers. When the thickness of the n-type epitaxial layer is greater than that in this embodiment, a second p-type isolation layer may be added to provide a structure in which the p-type layers are coupled in the depth direction.

A method for manufacturing the structure of this embodiment will now be described. There are generally two types of methods for forming the heavily-doped p-type buried layer 502.

In the first method, after boron ions are implanted into the surface of the n-type silicon substrate 501, the n-type silicon layer 503 is epitaxially grown. The doping concentration of the n-type substrate 501 is preferably in the range of 1E13 to 1E15 (/cm$^3$). The doping concentration of the n-type buried layer 502 may be in the range of 1E15 to 1E20 (/cm$^3$). The doping concentration of the n-type epitaxial layer 503 may be in the range of 1E14 to 1E16 (/cm$^3$). The thickness of the n-type epitaxial layer 503 is set depending on a required spectral sensitivity. The thickness thereof is preferably about 2 to 6 μm for a typical visible-light image sensing device.

In the second method, with an accelerated energy of 1 MeV to 5 MeV, boron ions are implanted through the surface of an n-type silicon substrate having a doping concentration of 1E14 to 1E16 (/cm$^3$) or an epitaxially-grown n-type silicon substrate, to form the heavily-doped p-type buried layer 502. The surface side of the heavily-doped p-type buried layer 502 becomes the n-type epitaxial layer 503 shown in FIG. 5. Next, the p-type isolation layers 504a and 504b and then the p well layers 505a and 505b are formed by patterning and ion implantation. The net doping concentration of the p-type isolation layers 504a and 504b, i.e., the doping concentration thereof after being cancelled out by the doping concentration of the underlying n-type silicon, can be in the range of 1E15 to 1E18 (/cm$^3$).

Designing the isolation layers 504a and 504b to have a doping concentration higher than that of the n-type epitaxial layer 503 allows the p-type layers to act as potential barriers without being depleted even when the pn junction of the photodiode is reverse biased. When the thickness of the epitaxial layer is about 4 μm as in this embodiment, the ion implantation range in the p-type isolation layers 504a and 504b is, preferably, 1.5 to 3.0 μm.

In this embodiment, boron is used as the ion species and a dosage of 6E11 (cm$^{-2}$) is implanted with an energy of 1,200 KeV. Under these conditions, the range of boron ions becomes 1.9 μm, which can provide electrical connection between the p-type isolation layers 504a and 504b and the heavily-doped p-type buried layer 502.

With regard to the p well layers 505a and 505b, the ion implantation range is, preferably, 0.5 to 1.5 μm. In this embodiment, boron is used as the ion species and a dosage of 1E12 (cm$^{-2}$) is implanted with an energy of 500 KeV. Under these conditions, the range of boron ions becomes 1.0 μm, which can provide electrical connection between the p well layer 505a and the p-type isolation layer 504a and between the p well layer 505b and the p-type isolation layer 504b.

The conditions for forming the p-type isolation layers 504a and 504b and p well layers 505a and 505b vary depending on the thickness of the epitaxial layer 503. When the thickness of the epitaxial layer is 6 μm or more, a structure having p-type isolation layers at two layers is preferable in order to electrically connect the p well layers with the heavily-doped p-type buried layer. When the thickness of the epitaxial layer is 2 μm or less, there is no need to provide the p-type isolation layers. The thickness of the epitaxial layer defines the spectral sensitivity at a longer wavelength of an image sensing device, and, in a typical visible light band, 4 μm is sufficient for the thickness thereof. Thus, the structure of this embodiment is advantageously used in an image sensing device for a visible light band.

Next, the channel stop layers 506a and 506b are formed by ion implantation, and then the field oxide films 507 are formed by common LOCOS separation or a recessed LOCOS process. After the polysilicon electrode 509 is formed, the p-type surface layer 510 and the heavily-doped n-type layer 511 are formed on the surface of the photodiode by ion implantation. In this manufacturing method, since processes after making the contact are analogous to those for the conventional image sensing devices, the description thereof will be omitted.

According to this embodiment, photocarriers that cannot be captured by the conventional photodiodes can also be captured, thereby improving the sensitivity. In this embodiment, although the epitaxial layer 503 has an n-conductivity type, it may have a p-conductivity type. Thus, naturally, the present invention is also applicable to a case in which all the conductivity types of those portions and layers are inverted to constitute a hole-storing pixel.

Figure 8:
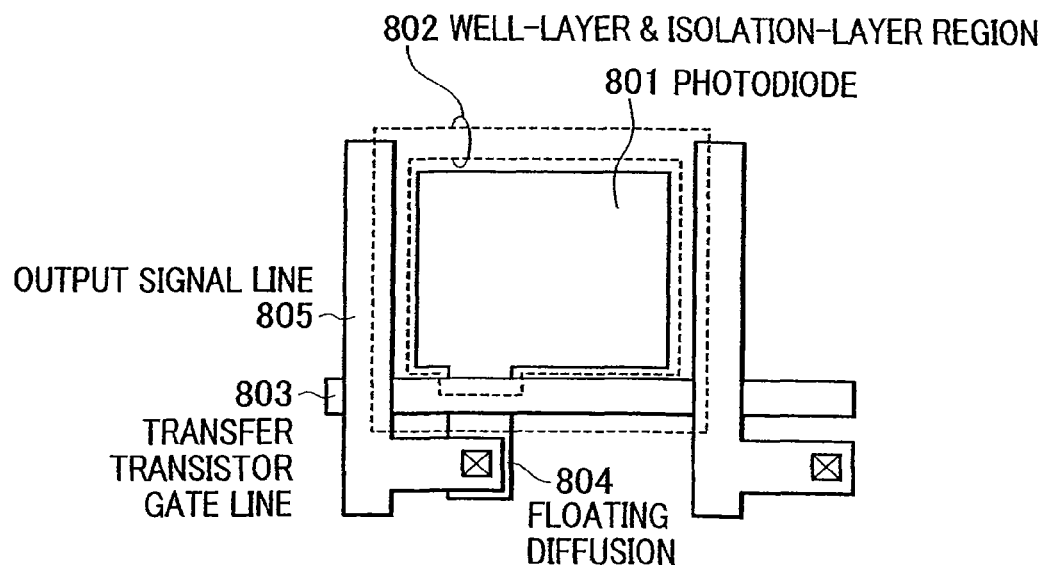
FIG. 8 is a plan view showing one example of a pixel of a solid-state image sensing device according to the present invention.

FIG. 8 is a plan view of one example of a pixel in the present invention. A p well-layer and isolation-layer region 802 is arranged as indicated by a dotted line so as to surround a photodiode 801. A transfer-transistor gate line 803 for transferring charge is arranged at one side of the photodiode 801. A floating diffusion region 804 is also provided to temporarily store transferred charge.

While an amplifying MOS transistor, a reset MOS transistor, and a row-selection MOS transistor are not shown in this plan view, the illustrated configuration is not intended to limit the arrangement of those devices to achieve the present invention. The main point in this plan view is that well and isolation layers surround the photodiode to provide isolation from adjacent pixels.

Figure 11:
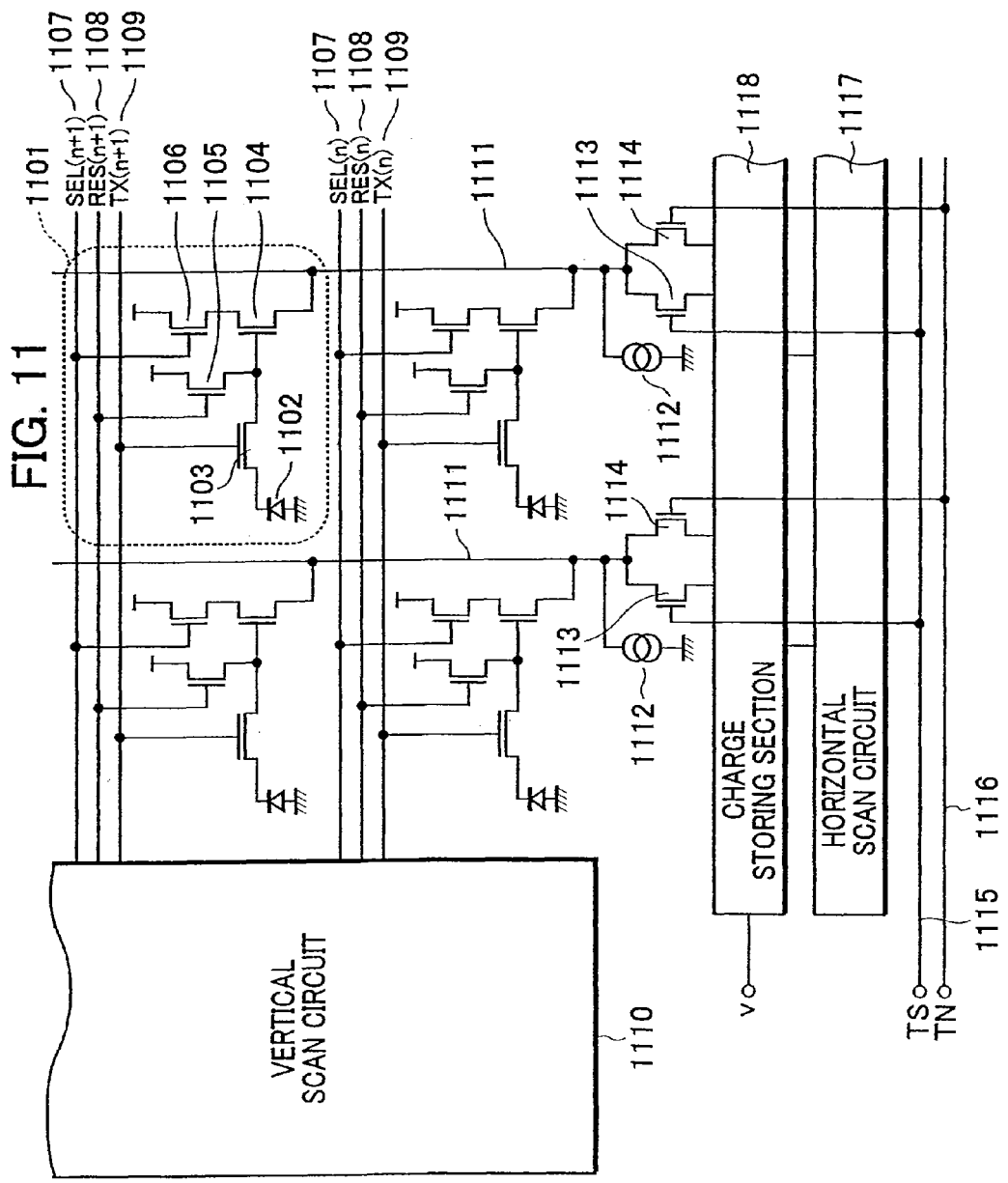
FIG. 11 is a circuit diagram of part of the solid-state image sensing device according to the present invention.

FIG. 11 is a schematic view of a circuit in which a large number of pixel circuits of the present invention are arranged in two dimensions. Pixels 1101 each have a photodiode 1102, a transfer MOS transistor 1103, an amplifying MOS transistor 1104, a reset MOS transistor 1105, and a selection MOS transistor 1106. The gates of the selection MOS transistors 1106 in the same row are connected to the same selection line 1107, the gates of the reset MOS transistors 1105 in the same row are connected to the same reset line 1108, and the gates of the transfer MOS transistors 1103 are connected to the same transfer line 1109. These lines 1107, 1108, and 1109 are scanned and selected by a vertical scan circuit 1110. Current sources 1112 are connected to the output lines 1111 in the corresponding columns, and the potentials of the output lines 1111 can be read by a source-follower operation.

The optical-signal-transfer MOS transistor 1113 that is selected by an optical-signal read line 1115 causes an optical signal on the corresponding output line 1111 to be stored in a charge storing section 1118, and, similarly, a noise-signal transfer MOS transistor 1114 that is selected by a noise-signal read line 1116 causes a noise signal to be stored in the charge storing section 1118. Optical and noise signals that are stored in the charge storing section 1118 are sequentially scanned and read by a horizontal scan circuit 1117. The difference of an optical signal and a noise signal which are read is output by a differential amplifier circuit (not shown).

Figure 12:
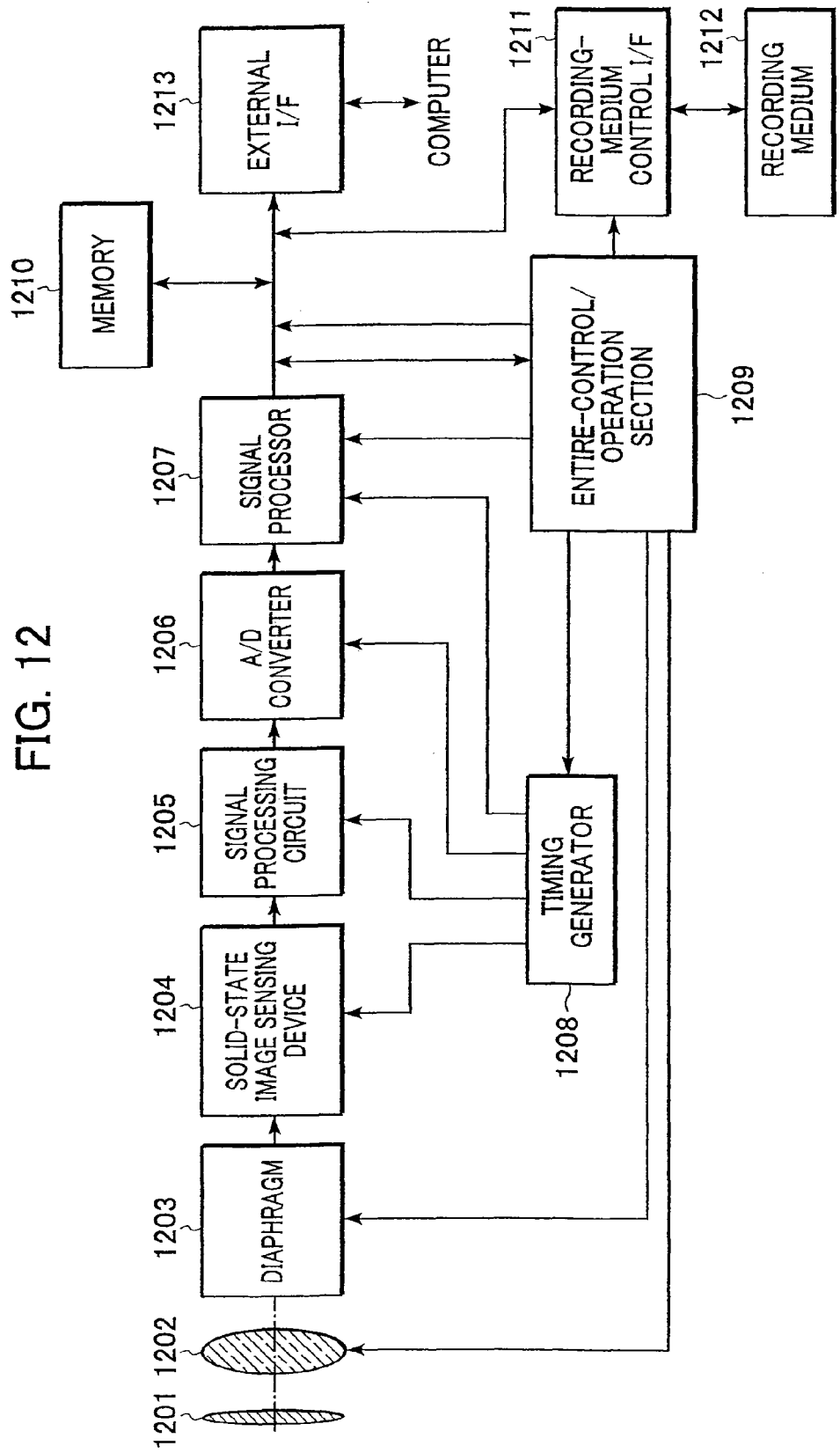
FIG. 12 is a block diagram of a camera system using the solid-state sensing device according to the present invention.
Figure 13:
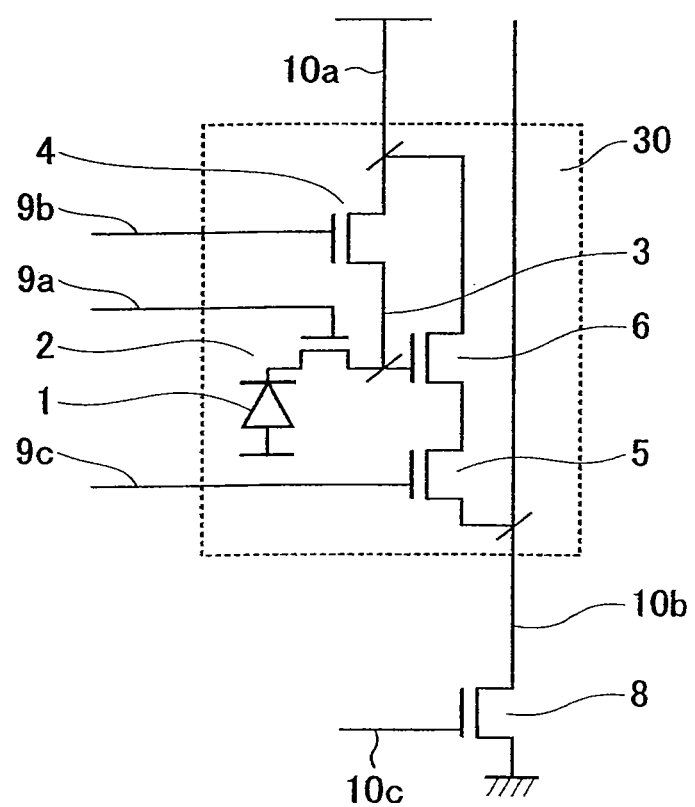
FIG. 13 is a circuit diagram of a typical example of a CMOS sensor pixel for use in a solid-state image sensing device.
Figure 14:
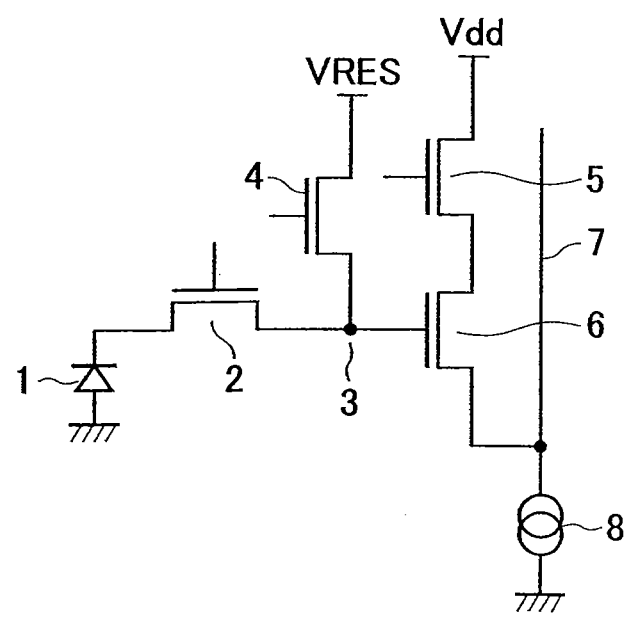
FIG. 14 is a circuit diagram of a pixel of a conventional solid-state image sensing device.
Figure 15:
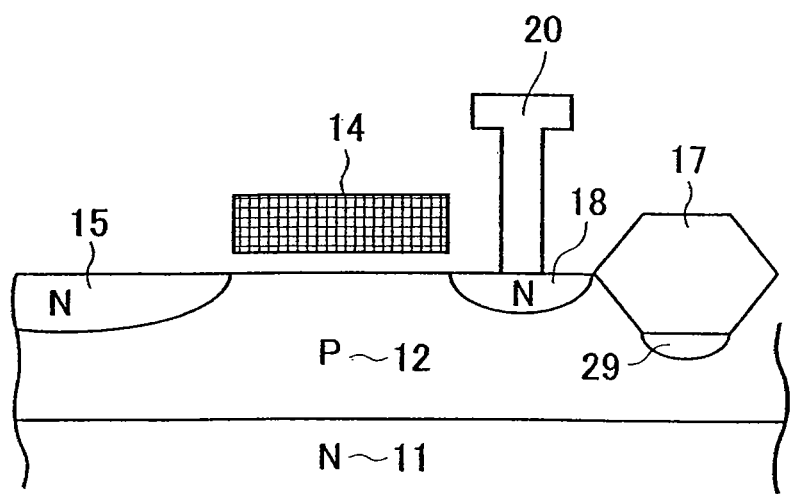
FIG. 15 is a schematic sectional view of the solid-state image sensing device shown in FIG. 13.

FIG. 12 shows a circuit block of an example of a camera system incorporating the solid-state image sensing device of the present invention. A shutter 1201 is placed in front of an image-taking lens 1202 to control an exposure. A diaphragm 1203 controls the light intensity as needed, and an image is formed on a solid-state image sensing device 1204. A signal output from the solid-state image sensing device 1204 is processed by a captured-image signal processing circuit 1205 and is converted by an A/D converter 1206 from an analog signal to a digital signal. The output digital signal is further subjected to computational operations by a signal processor 1207. The resulting digital signal is stored in a memory 1210 and/or is transferred to an external apparatus via an external interface (I/F) 1213. A timing generator 1208 controls the solid-state image sensing device 1204, the signal processing circuit 1205, the A/D converter 1206, and the signal processor 1207. An entire-control/operation section 1209 controls the entire system. The output digital signal is recorded as image data in a recording medium 1212 via a recording-medium control interface (I/F) 1211, which is controlled by the entire-control/operation section 1209.

Not only can the present invention substantially increase the sensitivity of a CMOS solid-state image sensing device, but also allows for the configuration of a photodiode having an increased volume of an n-type layer compared to conventional configurations. This can therefore increase saturation charge in the image sensing device.

In addition, the doping concentration of the junction portion where the p-type surface layer 510 and the n-type epitaxial layer 503 of the buried photodiode are in contact with each other is lower than that of the conventional configurations. Thus, the present invention can reduce the rate of pixel defects, thereby improving the quality compared to the conventional examples.

Sixth Embodiment

Figure 6:
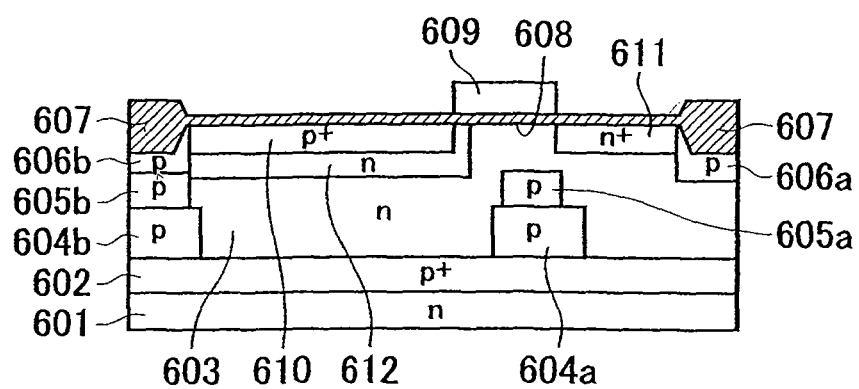
FIG. 6 is a schematic sectional view of a solid-state image sensing device according to a sixth embodiment of the present invention.

A sixth embodiment will now be described with reference to FIG. 6. FIG. 6 is a schematic sectional view of a solid-state image sensing device according to a sixth embodiment of the present invention. Since the wiring portions except the gate electrode are the same as those in the fifth embodiment, the common portions are not shown.

What is different from the fifth embodiment is that another n-type layer 612 is provided adjacent to the surface of an n-type epitaxial layer 603 in the photodiode structure. The n-type layer 612 is placed under a p-type surface layer 610 and also extends to a region under part of a polysilicon gate electrode 609. The doping concentration of the n-type layer 612 is higher than that of the n-type epitaxial layer 603, and is, preferably, about 1E15 to 1E17 (/cm$^3$). Since the n-type layer 612 is a region where the potential for electrons is low, electrons gather in the n-type layer 612 when charge is being stored. Thus, the structure of this embodiment is suitable for completely transferring electrons when the MOS transistor transfers charge. Complete transfer of the electrons can eliminate a fluctuation in the number of electrons remaining in the photodiode, which makes it possible to configure an image sensing device having low random noise.

The n-type layer 612 is formed by patterning and ion implantation in a process prior to the formation of the polysilicon gate electrode 609. Alternatively, after the polysilicon gate electrode 609 is formed, the n-type layer 612 can be laid under the polysilicon gate electrode 609 by oblique ion implantation. Other portions in the sectional view of FIG. 6 are the same as those in the fifth embodiment. P-type isolation layers 604a and 604b and p well layers 605a and 605b, which are critical portions in the present invention, can be formed using the same method as for the fifth embodiment. Since other portions are analogous, the descriptions thereof will be omitted.

This embodiment offers an advantage in that charge being stored is easily transferred by the transfer MOS transistor, since a portion having a doping concentration higher than the other portions is provided adjacent to the surface of the cathode portion of the photodiode. This structure facilitates complete transfer of photodiode charge, which can achieve a device having less random noise. This embodiment can also be applied to the plane structure in FIG. 8, the circuit configuration in FIG. 11, and the block configuration in FIG. 12, which provides an image sensing system that operates effectively.

Seventh Embodiment

Figure 7:
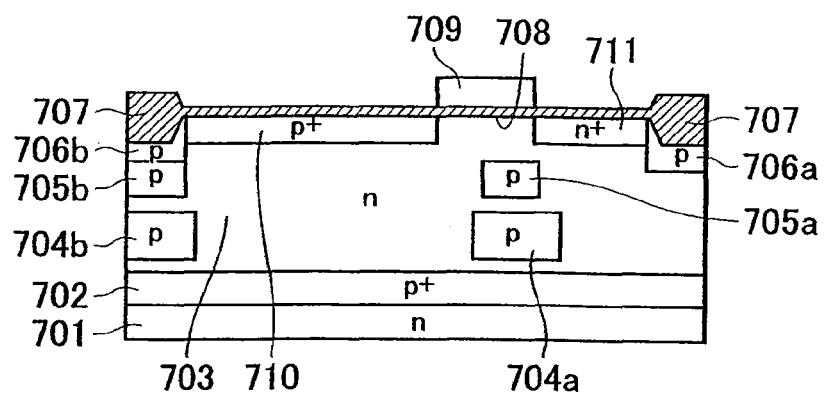
FIG. 7 is a schematic sectional view of a solid-state image sensing device according to a seventh embodiment of the present invention.

A seventh embodiment will now be described with reference to FIG. 7. FIG. 7 is a schematic sectional view of a solid-state image sensing device according to a seventh embodiment of the present invention.

In this embodiment, in terms of dopant concentration, p-type isolation layers 704a and 704b are not in complete contact with p well layers 705a and 705b and a heavily-doped p-type buried layer 702. Even with this structure, it can advantageously be used as long as these p-type regions 704a, 704b, 705a, 705b, and 702 form sufficient potential barriers against the n-type region (an n-type epitaxial layer 703) of the photodiode. The potential barriers can be determined from the amount of charge desired to be stored in the photodiode. While the thickness of the n-type epitaxial layer in the fifth embodiment is 2 to 6 μm, the number of isolation layers can be increased in the depth direction in order to form potential barriers with the p-type layers. Since other portions in the sectional view of FIG. 7 are the same as those in the fifth embodiment, the description thereof will be omitted.

As illustrated in this embodiment, the present invention can advantageously be used as long as sufficient potential barriers are formed even when the isolation layers are out of contact with the p well layers and the p-type buried layer. That is, it is sufficient to arrange the number and doping concentration of required isolation layers according to the essence of this embodiment, depending on the thickness of the n-type epitaxial layer.

Eighth Embodiment

Figure 9:
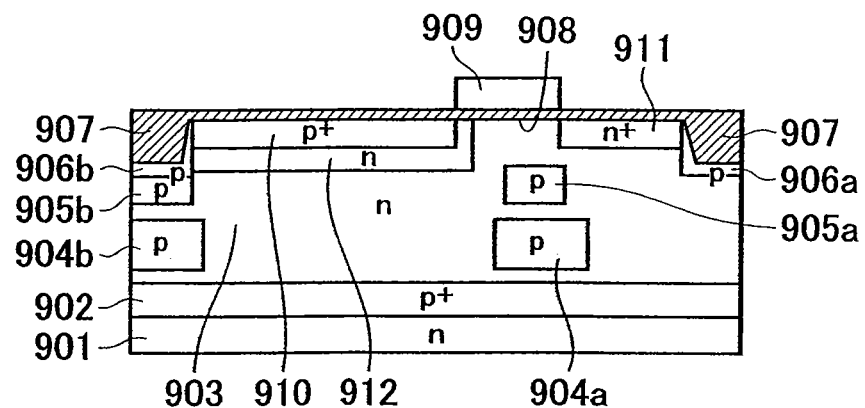
FIG. 9 is a schematic sectional view of a solid-state image sensing device according to an eighth embodiment of the present invention.

An eighth embodiment will now be described with reference to FIG. 9. FIG. 9 is a schematic sectional view of a solid-state image sensing device according to an eighth embodiment of the present invention. This embodiment illustrates a case in which STI (Shallow Trench Isolation) is employed as an element isolation method. In this embodiment, in terms of dopant concentration, p-type isolation layers 904a and 904b are not in complete contact with p well layers 905a and 905b and a heavily-doped p-type buried layer 902. This structure is the same as that of the seventh embodiment.

Referring to FIG. 9, p-type regions 906a and 906b are arranged under STI oxide films 907 so that the interfaces between the STI oxide films 907 and the silicon are not depleted. The p-type regions 906a and 906b are particularly significant in order to prevent the side surfaces of the STI oxide films 907 from being depleted. The p well layers 905a and 905b are formed at the same depth as those of the seventh embodiment, and prevent charge from leaking into adjacent pixels. Further, the p well layers 905a and 905b control the transfer path for the transfer MOS transistor and also control a threshold thereof. The p well layer 905b, which is located immediately under the STI oxide film 907, provides a potential barrier immediately under the device-isolating region and also serves as a channel stopper under the STI oxide film 907.

As in the other embodiments, the p-type isolation layers 904a and 904b provide potential barriers between the p well regions 905a and 905b and the heavily-doped p-type buried region 902.

Since other structures are the same as those of the sixth and seventh embodiments, the descriptions thereof will be omitted. Since STI is used to isolate elements, this embodiment has additional advantages. Specifically, isolation between adjacent photodiodes is enhanced. Further, the shape of a resist is stabilized even when micro-processing is involved, since the surface is flat. In addition, since ion implantation can be used to form the p-type isolation layers and the p well layers after the formation of the STI oxide films, a micropattern can be formed such that the p-type isolation layers and the p well layers do not expand due to heat diffusion during oxidation. Accordingly, this embodiment using STI is suitable for manufacture of an image sensing device having micro pixels.

Ninth Embodiment

Figure 10:
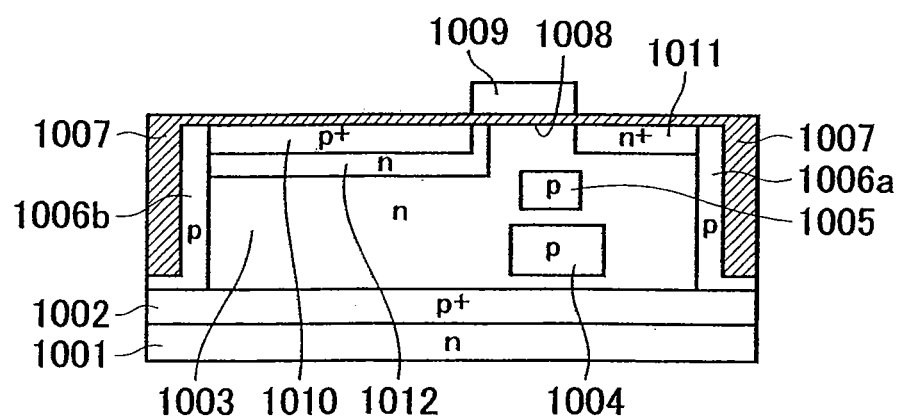
FIG. 10 is a schematic sectional view of a solid-state image sensing device according to a ninth embodiment of the present invention.

A ninth embodiment will now be described with reference to FIG. 10. FIG. 10 is a schematic sectional view of a solid-state image sensing device according to a ninth embodiment of the present invention. This embodiment illustrates a case in which DTI (Deep Trench Isolation) is employed as an element isolation method.

In this embodiment, in terms of dopant concentration, a p-type isolation layer 1004 and a p well layer 1005 are not in complete contact with a heavily-doped p-type buried layer 1002. This structure is the same as those of the seventh and eighth embodiments. Trench-isolation oxide films 1007 extend to a depth of 3 μm in the silicon. P-type regions 1006a and 1006b cover the interfaces between the trench-isolation oxide films 1007 and the silicon to prevent the interfaces thereof from being depleted. The p-type regions 1006a and 1006b prevent dark current from being generated and also form potential barriers between the trench-isolation oxide films 1007 and the heavily-doped p-type buried layer 1002. Since other structures are the same as those of the sixth to eighth embodiments, the descriptions thereof will be omitted.

Since deep trench isolation is used to isolate elements, this embodiment has additional advantages. Specifically, isolation between adjacent photodiodes is further improved. Isolations regions that are narrow and deep can be provided, thereby providing a structure suitable for micro pixels.

As described above, according to the present invention, since the potential barriers are provided in the pixel structure, signal charge is less likely to be absorbed by portions other than the photodiode. Thus, it is possible to achieve a solid-state image sensing device having high sensitivity. In addition, according to the present invention, it is possible to provide a photodiode having an n-type layer large in volume, compared to the conventional configurations. Thus, it is possible to increase saturation charge in the image sensing device.

Additionally, the doping concentration of the junction portion where the n-type epitaxial layer and the p-type surface layer of the buried photodiode are in contact with each other is lower than the doping concentration of the conventional configurations. Thus, the present invention can reduce the rate of pixel defects, thereby improving the quality compared to the conventional examples.

Furthermore, a portion having a higher doping concentration than that of the other portions is provided adjacent to the cathode portion of the photodiode to thereby facilitate complete transfer of photodiode charge. Thus, it is possible to achieve a solid-state image sensing device having low random noise.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid state image sensing device comprising:
   a photoelectric conversion unit having a first semiconductor region of a first conductivity type and a second semiconductor region of a second conductivity type, the first conductivity type and the second conductivity type being opposite to each other;
   a first transistor that has (a) a first gate, and (b) a drain region and/or a source region of the first conductivity type;
   a second transistor that has (a) a second gate, and (b) a drain region and/or a source region of the first conductivity type;
   a potential barrier having the second conductivity type, a part of the potential barrier being at least partially overlapped by the first gate and a part of the potential barrier being at least partially overlapped by the second gate; and
   an isolation region containing an insulator configured to isolate the photoelectric conversion unit from at least one of the first and second transistors, a part of the potential barrier being at least partially overlapped by the isolation region, wherein the potential barrier is provided so as to surround the photoelectric conversion unit when viewed from an overhead direction, wherein the potential barrier has a charge path through which charges overflow from the photoelectric conversion unit, and wherein a part of the first semiconductor region of the photoelectric conversion unit and a part of the potential barrier are provided at a same depth from a surface of the photoelectric conversion unit.

2. The solid state image sensing device according to claim 1, further comprising a semiconductor substrate of the first conductivity type provided under the second semiconductor region.

3. The solid state image sensing device according to claim 1, wherein the drain region and/or the source region of the first transistor is provided in the second semiconductor region.

4. The solid state image sensing device according to claim 1, wherein the second transistor is a reset transistor.

5. The solid state image sensing device according to claim 1, wherein the potential barrier includes a first part and a second part, and wherein the photoelectric conversion unit is provided between the first part and the second part.

6. The solid state image sensing device according to claim 1, wherein the potential barrier is located apart from the top surface of the photoelectric conversion unit.

7. The solid state image sensing device according to claim 1, wherein the first transistor is a transfer transistor.

8. The solid state image sensing device according to claim 1, wherein the second transistor is one of an amplifying transistor and or a selection transistor.

9. The solid state image sensing device according to claim 1, wherein the first transistor is a transfer transistor, and wherein the potential barrier is not provided under at least a part of the first gate.

10. The solid state image sensing device according to claim 1, wherein the potential barrier includes a plurality of layers of the second conductivity type, the plurality of layers arranged at a different depth from each other.

11. The solid state image sensing device according to claim 1 further comprising:
a channel stopper region of the second conductivity type arranged under the insulator, a part of the potential barrier being at least partially overlapped by the channel stopper region.

12. The solid state image sensing device according to claim 11, wherein the channel stopper region is connected to the part of the potential barrier at least partially overlapped by the channel stopper region.

13. A solid state image sensing device comprising:
a photoelectric conversion unit having a first semiconductor region of a first conductivity type and a second semiconductor region of a second conductivity type, the first conductivity type and the second conductivity type being opposite to each other;
a first transistor that has (a) a first gate, and (b) a drain region and/or a source region of the first conductivity type;
a second transistor that has (a) a second gate, and (b) a drain region and/or a source region of the first conductivity type;
a potential barrier having the second conductivity type, a part of the potential barrier being at least partially overlapped by the first gate and a part of the potential barrier being at least partially overlapped by the second gate; and an isolation region containing an insulator configured to isolate the photoelectric conversion unit from at least one of the first and second transistors, a part of the potential barrier being at least partially overlapped by the isolation region, wherein the potential barrier is provided so as to surround the photoelectric conversion unit when viewed from an overhead direction, wherein the potential barrier has an opening through which charges overflow from the photoelectric conversion unit, and wherein a part of the first semiconductor region of the photoelectric conversion unit and a part of the potential barrier are provided at a same depth from a surface of the photoelectric conversion unit.

14. The solid state image sensing device according to claim 13, further comprising a semiconductor substrate of the first conductivity type provided under the second semiconductor region.

15. The solid state image sensing device according to claim 13, wherein the drain region and/or the source region of the first transistor is provided in the second semiconductor region.

16. The solid state image sensing device according to claim 13, wherein the second transistor is a reset transistor.

17. The solid state image sensing device according to claim 13, wherein the potential barrier includes a first part and a second part, and wherein the photoelectric conversion unit is provided between the first part and the second part.

18. The solid state image sensing device according to claim 13, wherein the potential barrier is located apart from the top surface of the photoelectric conversion unit.

19. The solid state image sensing device according to claim 13, wherein the first transistor is a transfer transistor.

20. The solid state image sensing device according to claim 13, wherein the second transistor is one of an amplifying transistor and a selection transistor.

21. The solid state image sensing device according to claim 13, wherein the first transistor is a transfer transistor, and wherein the potential barrier is not provided under at least a part of the first gate.

22. The solid state image sensing device according to claim 13, wherein the third semiconductor region includes a plurality of layers of the second conductivity type, each of the plurality of layers being arranged at a different depth from each other.

23. The solid state image sensing device according to claim 13 further comprising:
a channel stopper region of the second conductivity type arranged under the insulator, a part of the third semiconductor region being at least partially overlapped by the channel stopper region.

24. The solid state image sensing device according to claim 23, wherein the channel stopper region is connected to the part of the third semiconductor region at least partially overlapped by the channel stopper region.

25. A solid state image sensing device comprising:
a photoelectric conversion unit having a first semiconductor region of a first conductivity type and a second semiconductor region of a second conductivity type, the first conductivity type and the second conductivity type being opposite to each other;

a first transistor that has (a) a first gate, and (b) a drain region and/or a source region of the first conductivity type;

a second transistor that has (a) a second gate, and (b) a drain region and/or a source region of the first conductivity type;

a third semiconductor region of the second conductivity type, a part of the third semiconductor region being at least partially overlapped by the first gate and a part of the third semiconductor region being at least partially overlapped by the second gate, wherein an impurity concentration of the third semiconductor region is higher than an impurity concentration of the second semiconductor region; and an isolation region containing an insulator configured to isolate the photoelectric conversion unit from at least one of the first and second transistors, a part of the third semiconductor region being at least partially overlapped by the isolation region, wherein the third semiconductor region is provided so as to surround the photoelectric conversion unit when viewed from an overhead direction, wherein the third semiconductor region has a charge path through which charges overflow from the photoelectric conversion unit, and wherein a part of the first semiconductor region of the photoelectric conversion unit and a part of the third semiconductor region are provided at a same depth from a surface of the photoelectric conversion unit.

26. A solid state image sensing device comprising:

a photoelectric conversion unit having a first semiconductor region of a first conductivity type and a second semiconductor region of a second conductivity type, the first conductivity type and the second conductivity type being opposite to each other;

a first transistor that has (a) a first gate, and (b) a drain region and/or a source region of the first conductivity type;

a second transistor that has (a) a second gate, and (b) a drain region and/or a source region of the first conductivity type;

a third semiconductor region of the second conductivity type, a part of the third semiconductor region being at least partially overlapped by the first gate and a part of the third semiconductor region being at least partially overlapped by the second gate, wherein an impurity concentration of the third semiconductor region is higher than an impurity concentration of the second semiconductor region; and an isolation region containing an insulator configured to isolate the photoelectric conversion unit from at least one of the first and second transistors, a part of the third semiconductor region being at least partially overlapped by the isolation region, wherein the third semiconductor region is provided so as to surround the photoelectric conversion unit when viewed from an overhead direction, wherein the third semiconductor region has an opening through which charges overflow from the photoelectric conversion unit, and wherein a part of the first semiconductor region of the photoelectric conversion unit and a part of the third semiconductor region are provided at a same depth from a surface of the photoelectric conversion unit.

* * * * *